United States Patent [19]

Hargarten et al.

[11] Patent Number: 4,817,448
[45] Date of Patent: Apr. 4, 1989

[54] AUTO ZERO CIRCUIT FOR FLOW METER

[75] Inventors: James W. Hargarten, Lafayette; Allan L. Samson, Berthoud, both of

[73] Assignee: Micro Motion, Inc., Boulder, Colo.

[21] Appl. No.: 903,337

[22] Filed: Sep. 3, 1986

[51] Int. Cl.⁴ .................................................. G01F 1/84
[52] U.S. Cl. ............................... 73/861.38; 307/525; 324/83 D; 328/133
[58] Field of Search .................... 73/861.38, 861.29; 307/234, 510, 511, 525; 328/109, 133, 135; 324/830

[56] References Cited

U.S. PATENT DOCUMENTS

| Re. 31,450 | 11/1983 | Smith | 73/861.38 |
|---|---|---|---|
| 3,021,481 | 2/1962 | Kalmus et al. | 324/83 |
| 3,039,024 | 6/1962 | Spooner | 317/149 |
| 3,087,532 | 4/1963 | Roth | 73/3 |
| 3,209,591 | 10/1965 | Lester et al. | 73/181 |
| 3,579,104 | 5/1971 | Pignard et al. | 324/83 D |
| 3,644,835 | 2/1972 | Thompson | 328/133 |
| 3,824,481 | 7/1974 | Sponholz et al. | 328/162 |
| 3,906,384 | 9/1975 | Schiffman | 328/165 |
| 3,924,612 | 12/1975 | Dempster et al. | 128/2.08 |
| 3,937,944 | 2/1976 | Radzyner et al. | 235/184 |
| 3,982,434 | 9/1976 | McMurtrie | 73/194 VS |
| 4,020,685 | 5/1977 | Van Millingen et al. | 73/136 A |
| 4,054,835 | 10/1977 | Los et al. | 324/109 |
| 4,096,575 | 6/1978 | Itoh | 364/571 |
| 4,138,649 | 2/1979 | Schaffer | 330/9 |
| 4,150,433 | 4/1979 | Kaniel | 364/571 |
| 4,163,947 | 8/1979 | Weedon | 328/128 |
| 4,169,232 | 9/1979 | Henrich | 307/354 |
| 4,193,039 | 3/1980 | Massa et al. | 328/162 |
| 4,246,497 | 1/1981 | Lawson et al. | 307/232 |
| 4,331,920 | 5/1982 | Kalisch et al. | 324/225 |
| 4,367,654 | 1/1983 | Ymker et al. | 73/861.29 |
| 4,372,168 | 2/1983 | Watson | 73/861.28 |
| 4,483,202 | 11/1984 | Ogura et al. | 73/861.27 |
| 4,491,025 | 1/1985 | Smith et al. | 73/861.38 |
| 4,506,175 | 3/1985 | Reitmeier et al. | 307/525 |

FOREIGN PATENT DOCUMENTS

| 0083144 | 7/1983 | European Pat. Off. . |
| 0148685 | 7/1985 | European Pat. Off. . |
| 9143109 | 7/1980 | German Democratic Rep. . |
| 58-151518 | 9/1983 | Japan . |
| 58-156813 | 9/1983 | Japan . |

Primary Examiner—Herbert Goldstein

[57] ABSTRACT

An electronic signal processor for substantially eliminating timing errors in determining the time difference between two periodic analog signals which uses switches that allow one of the two signals to be connected to one channel for digitizing that signal and the other signal to be connected to a second channel, then the switches, after about a cycle, reverse the connections. The measured time differences over two cycles are then added or subtracted to substantially eliminate timing errors caused by variations in the operational characteristics of electronic components in the signal processor.

10 Claims, 5 Drawing Sheets

AUTO ZERO CIRCUIT FOR FLOW METER

BACKGROUND OF THE INVENTION

The present invention relates to the electronic processing of signals from Coriolis mass flow rate meters to determine the fluid mass flow rates passing through the meters. Mass flow rates of fluids passing through Coriolis mass flow rate meters incorporating the present invention cause incremental deflections of vibrating conduits which are proportional to the magnitude of the mass flow rate. Associated with each conduit are two analog devices that accurately provide signals linearly representative of the actual movement of the conduit including the incremental deflections. The signals from the analog devices are then processed by the present invention to measure the time difference between the signals at comparable signal levels and to determine from the time difference measurements the actual fluid mass flow rate passing through the meter.

DESCRIPTION OF THE PRIOR ART

Coriolis mass flow rate meters are electromechanical devices having conduits which can be rotated or oscillated depending on how the conduits are mounted. The combination of the motion of the conduit and the flow of fluid thrugh the conduit generates Coriolis forces which either assist or retard the motion of the conduit. Mounting of Coriolis mass flow rate meter conduits so they can be resonantly vibrated is taught in U.S. Pat. No. Re 31,450, entitled Method and Structure for Flow Measurement and issued Nov. 29, 1983. Operating a flow meter in accordance with U.S. Pat. No. Re 31,450 results in a situation where the mass flow rate of a fluid passing through a vibrating conduit is directly related to the time difference between passage of one portion of the conduit, as deflected by Coriolis forces, past a preselected point in the travel of the conduit and the passage of a second portion of the conduit, as deflected by Coriolis forces in a different direction, past a corresponding second pre-selected point in the travel of the conduit.

To measure time differences it has been known to use digital devices such as optical sensors having a light source and a photo sensor where an interrupting flag is attached to the conduit so as to either allow light to energize the photo sensor or block the light, e.g. see U.S. Pat. No. Re 31,450. Signals from digital devices are used to indicate when two portions of the conduit pass pre-selected points in the travel of the conduit so that the relevant time difference can be determined. The geometric relationship of the light source, photo sensor and interrupting flag for each digital optical sensor determines the positioning of the pre-selected points. A problem associated with such an arrangement is that changes in the geometric relationships change the location of the pre-selected points and cause errors in measuring time differences. The multiple components of digital optical sensors as used on Coriolis mass flow rate meters are not mounted in close relationship to each other on the same structure and are mounted on structures which have large lever arms. Therefore, fluctuations in ambient conditions such as temperature cause the locations of components to shift with respect to each other, which causes errors in measuring time differences. This problem has been recognized, and to overcome the resulting bias errors, it is known that analog velocity sensors which accurately provide linear signals representative of the entire motion of the conduit can be used, e.g. see U.S. Pat. No. 4,422,338, entitled Method and Apparatus for Mass Flow Measurement and issued Dec. 27, 1983. The linear signals from velocity sensors as disclosed in U.S. Pat. No. 4,422,338 can be processed so as to provide the required time difference measurements for determining mass flow rate. These time difference measurements are free of errors caused by mechanical shifting of the relationships between structures on which sensor components are mounted as caused by variations in ambient conditions.

SUMMARY OF THE INVENTION

When analog velocity sensors are used with Coriolis mass flow rate meters having resonantly oscillated flow conduits, each analog signal can be processed by an electronic channel comprising an amplifier and a level detector, preferably a zero crossing detector such as a comparator to digitize the signal. Temperature, aging, and other uncontrolled parameters can change the processing characteristics of the amplifiers and level detectors, such as gain, rise times and fall times, and offset voltages, and thereby cause errors in the final measurement of time differences. These changes in electronic processing characteristics if they were identical between the channels processing each signal would at most introduce a bias which could be cancelled when the time differences between the signals is determined. Small differences, however, in electronic processing characteristics between the channels processing each signal are inherent. It is an object of the present invention to eliminate the effects of differences in electronic processing characteristics and ensure that accurate time difference measurements free of errors caused by fluctuations in the electronic processing of signals can be made.

The invention can be used with either single or twin conduit Coriolis mass flow rate meters. Two analog velocity sensors are used with either single or twin conduit meters. Each analog sensor signal is fed to a channel consisting of an amplifier and a level detector with the resulting digital signal being used to determine the relevant time difference, TS, between the two signals. In the present invention, both of the analog velocity sensor signals are first passed through a Field Effect Transistor (FET) switching circuit which alternates the channels through which the signals are processed. For one cycle of the analog signals from the velocity sensors, which are sinusoidal in wave form, one signal is processed by a first amplifier and level detector and the other signal by a second amplifier and level detector. On the next cycle, the signal processing is switched so that the first signal is processed by the second amplifier and level detector, and the second signal is processed by the first amplifier and level detector. In this way, the changes in processing characteristics occurring in each channel are alternately affecting the two velocity sensor signals. From two cycles of signal oscillation, four time interval measurements are made with the difference in processing characteristics switched between first and second velocity sensor signals. By determining which velocity sensor signal is first output by a level detector for each time interval measurement and then by adding or subtracting each time difference measurement with the remaining three measurements, depending on which is the first level detector output, and dividing by four an accurate time interval measurement is obtained with the charged in processing characteristics eliminated.

BRIEF DESCRIPTION OF THE DRAWINGS

The various objects, advantages and novel features of the present invention will be more readily apprehended from the following detailed description when read in conjunction with the appended drawings, in which corresponding components are designated by the same reference numerals throughout the various figures.

DETAILED DESCRIPTION OF THE INVENTION

Figure 1:
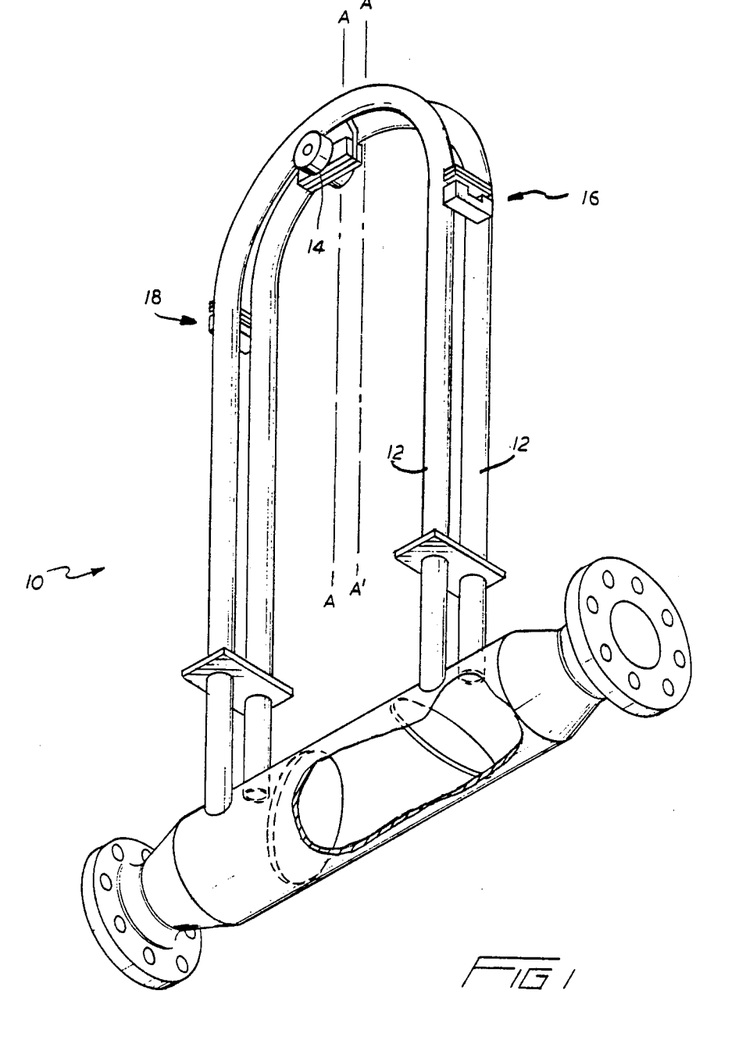
FIG. 1 is a perspective view of the flow tube arrangement for a Coriolis mass flow rate meter which can be used with the present invention.

A Coriolis mass flow rate meter, as generally designated by numeral 10, for which the signal processing of the present invention can be used, is shown in FIG. 1. The flow meter 10 incorporates twin conduits 12. Other arrangements utilizing single or twin flow conduits fixedly mounted so they can be vibrated resonantly can also be used with the present invention. The flow meter 10 in addition to the flow conduits 12 includes a driver 14, such as an electromagnetic system as is known in the art, to vibrate the flow conduits 12 as the prongs of a tuning fork. The flow meter 10 includes sensors 16 and 18. The sensors 16 and 18 are analog velocity sensors which provide analog signals linearly representative of the actual movement of the flow conduits 12 over their entire path of motion. When the flow conduits 12 are vibrating and fluid is flowing through them, the flow conduits 12 are deflected about axes A—A and A'—A' by Coriolis forces. The effects of these deflections are monitored by sensors 16 and 18. A detailed description of the mechanical operation of flow meter 10 is set forth in U.S. Pat. No. 4,491,025, entitled Parallel Path Coriolis Mass Flow Rate Meter and issued Jan. 1, 1985.

The sensors 16 and 18 are electromagnetic velocity sensors. Each sensor, 16 and 18, consists of a magnetic and a coil, with the coil designed so as to always be moved within the essentially uniform magnetic field of the magnet. Descriptions of the operation of sensors 16 and 18 for single and twin conduit Coriolis mass flow rate meters are set forth in the aforementioned U.S. Pat. Nos. 4,422,338 and 4,491,025. Though both sensors 16 and 18 output signals, which are generally sinusoidal in waveform, one sensor signal leads the other in time. This time difference between the signals results from the fact that the flow conduits 12 are deflected by Coriolis forces. The amount of the time difference between the two signals is related to the mass flow rate passing through the flow meter 10.

Figure 2:
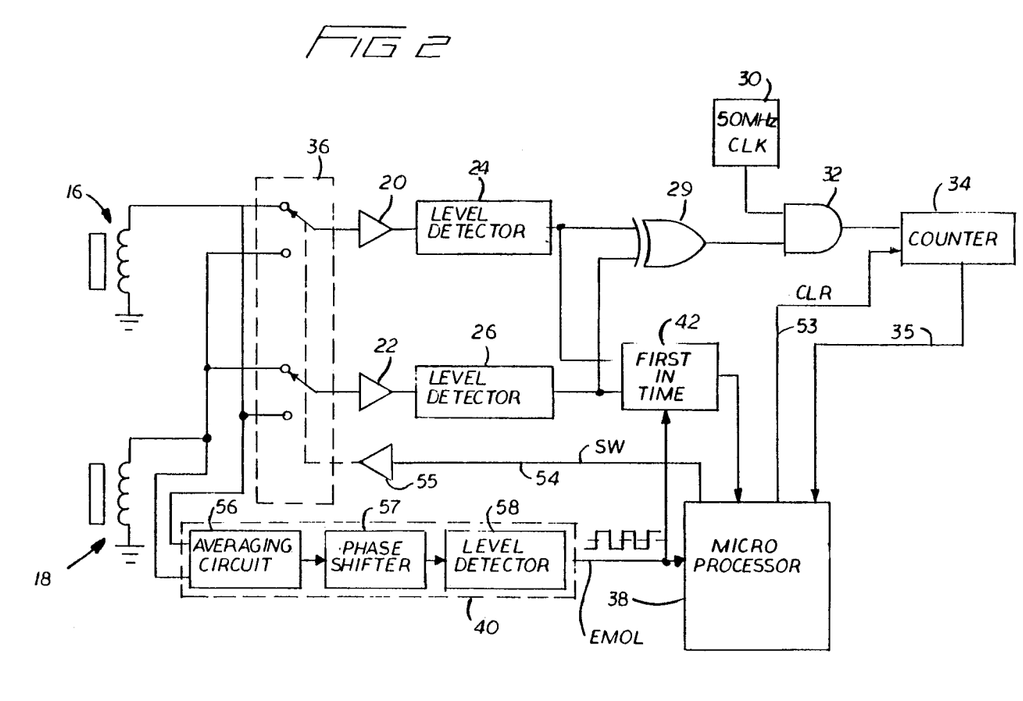
FIG. 2 is a schematic diagram of the electronic circuit of the present invention.
Figure 6:
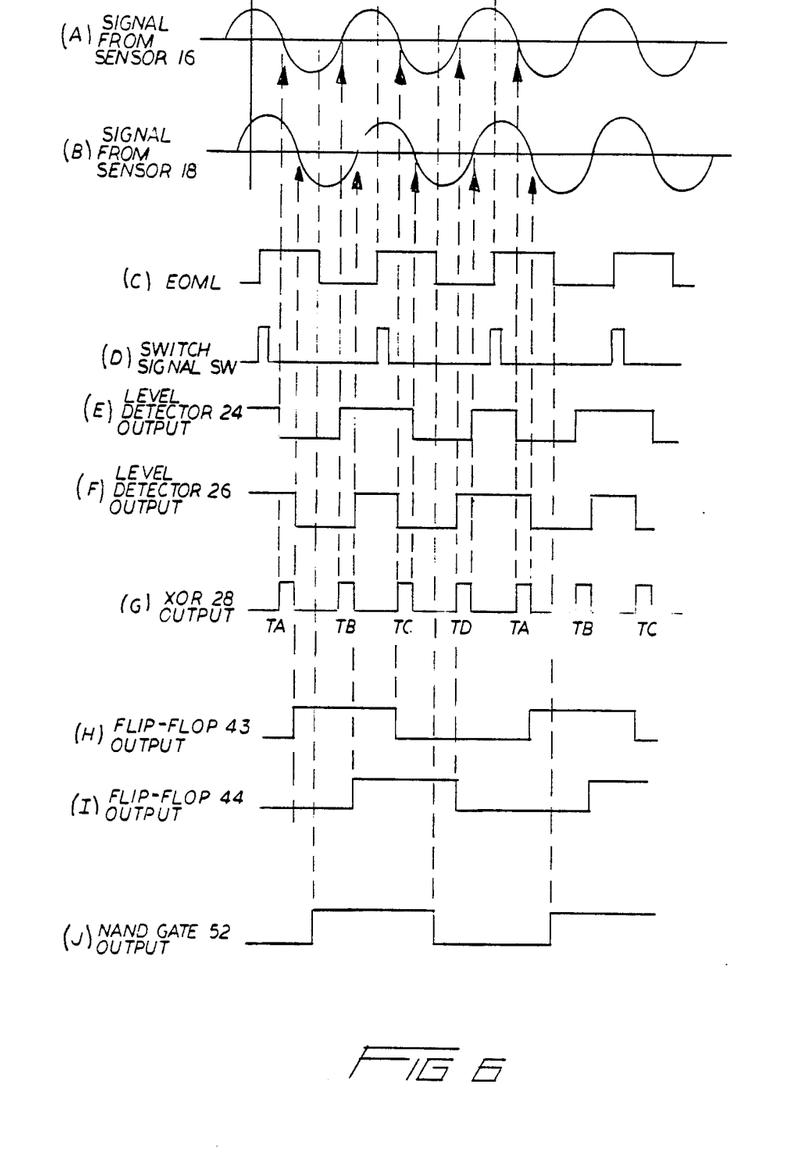
FIG. 6 is a timing diagram for the present invention showing the relationship of the output from the first-in-time circuit of FIG. 5.

To measure the time difference between the signals from sensors 16 to 18, each sensor signal is passed through a channel of processing including an amplifier, 20 or 22, and a level detector, 24 or 26, see FIG. 2. The level detectors 24 and 26 are substantially identical and will each produce an output signal that changes state whenever the input signal thereto crosses a predetermined level. Preferably, the level detectors are zero crossing detectors as this is a convenient point to measure; however, any other reference level within the magnitude of the input signals can also be used. The outputs of the level detectors 24 and 26 are then provided as inputs to an Exclusive OR (XOR) gate 28. The output of XOR gate 28 and the output from an oscillator 30 are inputs to an AND gate 34. The output of XOR gate 28 will be a logical zero whenever the outputs of the level detectors 24 and 26 are the same, i.e. either both outputs are logical ones or both outputs are logical zeros. The output of XOR gate 28 will be a logical one whenever the outputs of the level detectors 24 and 26 are different. For example, whenever the output level detector 24 is a logical one and that of level detector 26 is a logical zero or if the reverse is true, the output of XOR gate 28 will be a logical one. This is shown in timing diagram (G) of FIG. 6. Thus, the output of XOR gate 28 represents a time difference signal between the outputs of the two level detectors 24 and 26 that is, in turn, representative of the time difference between the signals from sensors 16 and 18. For the embodiment shown in FIG. 2 the output of the oscillator 30 has a frequency of 50 MHz. The output of AND gate 32 serves as the count input to the counter 34. The output signal of AND gate 32 will be a series of timing pulses at a frequency of 50 MHz that will last as long as the output of XOR gate 28 is present. Thus, the time difference between the signals from the sensors 16 and 18 can be accurately determined. The output count 35 of counter 34 provides a measure of one of the four time differences between the signals from sensors 16 and 18. Changes in the frequency at which the oscillator 30 is set can be made. This will effect the resolution of the time measurements that are made. Preferably, the oscillator 30 is a crystal controlled oscillator so that any variation about the oscillation frequency is insignificant when compared to the magnitude of the time measurements being made. The counter 34 is a 16 bit counter, although other size counters can also be used.

Variations between the operational characteristics of the amplifiers, 20 and 22, and the level detectors, 24 and 26, of the two channels of signal processing such as differences in amplification factors, rise times and fall times and offset voltages, will introduce errors in the measurement of time differences as provided from counter 34. To eliminate errors in time difference measurements, the present invention includes in the signal processing FET switches 36 (see FIG. 2) between the outputs of sensor 16 and 18 and the amplifiers 20 and 22. Other electronic or mechanical switches can be used and the use of the FET switch should not be considered as limiting. The positions of FET switches 36 are controlled by a microprocessor 38 so that for almost one cycle of the sinusoidal signals from sensors 16 and 18 they are respectively connected to the amplifiers 20 and 22. At about ninety degrees before the last predetermined level crossing of the signals from sensors 16 and 18, a switch shift circuit 40 provides an End of Measurement Level (EOML) signal to the microprocessor 38 which directs the FET switches 36 to connect sensors 16 and 18 to amplifiers 22 and 20, respectively, for the next cycle. With these interconnections of sensors 16 and 18 and amplifiers 20 and 22 all of the errors caused by variations in operational characteristics of amplifiers 20 and 22, and level detectors 24 and 26 are added to both the rise and fall times of the signals from sensors 16 and 18 on a two cycle basis.

Figure 3:
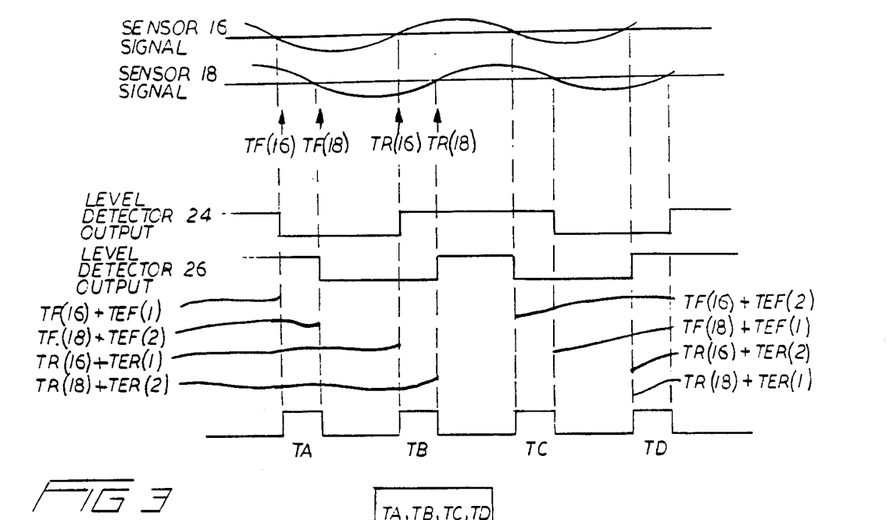
FIG. 3 is a timing diagram for the present invention showing where errors are added to time difference measurements.

Specifically, if the true rise time of the output of sensor 16 is designated as TR(16), See FIG. 3, and the true fall time as TF(6), and the true rise time of the output of sensor 18 is designated as TR(18) and the true fall time as TF(18); and, the errors in rise time and fall time for the circuit consisting of amplifier 20 and level detector 24 are TER(1) and TEF(1), respectively, and the errors in rise time and fall time for the circuit consisting of amplifier 22 and level detector 26 are TER(2) and TEF(2), respectively, then for the four time differences, TA, TB, TC, and TD, output by the XOR gate 28 as diagrammed in FIG. 3 the following relationships given in Eqs. 1–4 hold:

$$TA = |[TF(16) + TEF(1)] - [TF(18) + TEF(2)]| \quad (1)$$
$$TB = |[TR(16) + TER(1)] - [TR(18) + TER(2)]| \quad (2)$$
$$TC = |[TF(16) + TEF(2)] - [TF(18) + TEF(1)]| \quad (3)$$
$$TD = |[TR(16) + TER(2)] - [TR(18) + TER(1)]| \quad (4)$$

Adding these four time differences, TA, TB, TC, and TD, results in all of the errors, TER(1), TEF(1), TER(2) and TEF(2), cancelling each other out. So adding the four time differences together and dividing by four gives an accurate measure of the time difference signal, TS, between the output signals of the sensors, 16 and 18, without errors caused by differences in processing characteristics of amplifiers 20 and 22, or level detectors, 24 and 26. This relationship is given in Eq. 5.

$$TS = \frac{TA + TB + TC + TD}{4} \quad (5)$$

The assumptions, which were made above, that resulted in the errors TER(1), TEF(1), TER(2) and TEF(2), cancelling are that the flow direction through the meter is normal, not reversed, and that the flow magnitude is large compared to the errors. For this case the time difference errors TA and TB are greater than zero and the time difference errors TC and TD are less than zero.

Figure 4:
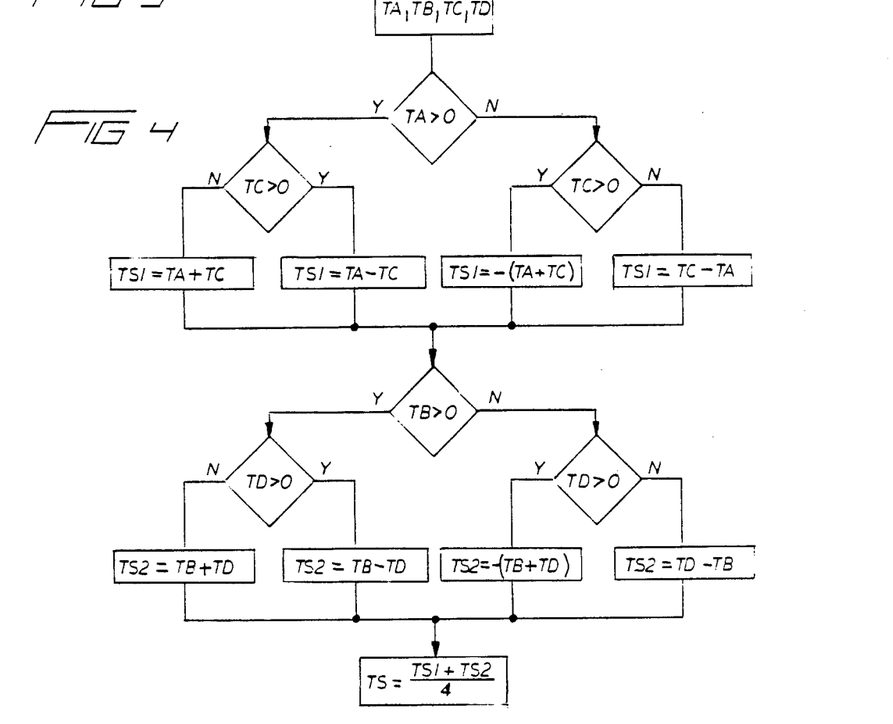
FIG. 4 is a flow chart for the logic implemented in the present invention.

The logic defining the rules for adding and subtracting time differences, TA, TB, TC and TD, depending on whether they are positive or negative, is set out in FIG. 4. The general form of the relationship for determining the time difference signal, TS, is given in Eq. 6 which is applicable for all magnitudes and directions of both flow and errors.

$$TS = \frac{\pm TA \pm TB \pm TC \pm TD}{4} \quad (6)$$

It will be realized that 16 different equations can be developed from Eq. 6. To implement the logic set out in FIG. 4, it is necessary first to determine which of the outputs of level detectors, 24 or 26, is first in time. The time order of the signals from the level detectors 24 and 26 determines whether time differences are positive or negative. This function in the present invention is accomplished using a first-in-time circuit 42 to provide the microprocessor 38 with signals that are keyed to whether time differences are positive or negative. With this information the microprocessor 38 implements the logic set out in FIG. 4.

Figure 5:
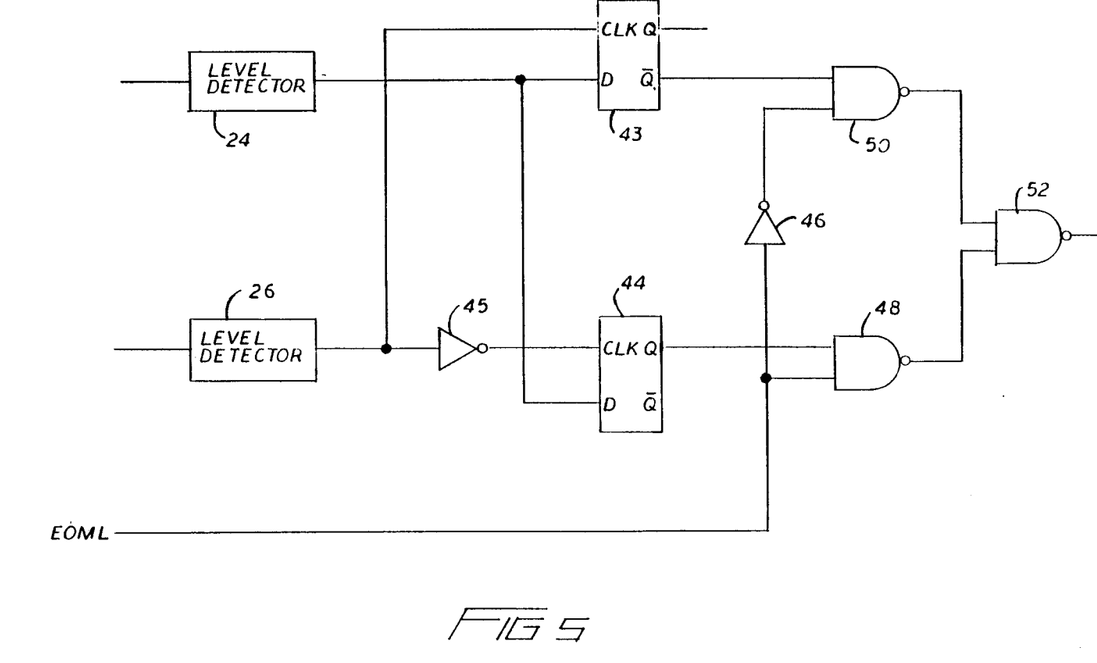
FIG. 5 is a schematic diagram of a first-in-time circuit for the present invention.

The first-in-time circuit 42 can be implemented numerous ways. An example of a useful design for a first-in-time circuit 42 is set out in FIG. 5. In this circuit the outputs of level detectors 24 and 26 are inputs to D-type flip-flops 43 and 44 that are edge triggered. Specifically, the output of the level detector 24 is input as the data signal, D, to flip-flop 43, and as the data signal, D, to flip-flop 44. The clock input signal, CLK, to flip-flop 43 is the output of level detector 26. This arrangement results in flip-flop 43 clocking in data from level detector 24 on the falling edge of the output from level detector 26. For time differences TA and TC, the inverted output, Q, of flip-flop 43 is a logical one if the output of level detector 24 falls before the output of level detector 26 and is a logical zero if the output of level detector 24 falls after the output of level detector 26. Flip-flop 44 clocks in data from level detector 24 on the rising edge of the output from level detector 26. To accomplish this functioning of flip-flop 44, the output of level detector 26 is processed through an inverter 45 the output of which is then connected to the clock input, CLK, of flip-flop 44. For time differences TB and TD and with these inputs, the noninverted output, Q, of flip-flop 44 is a logical one if the output of level detector 24 rises before that of level detector 26 and is a logical zero if the the output of level detector 24 rises after that of level detector 26. This functioning of the flip-flops 43 and 44 is illustrated in the timing diagrams (E), (F), (H) and (I) of FIG. 6.

To read the outputs of flip-flops 43 and 44 into the microprocessor 38, a multiplexer circuit consisting of an inverter 46 and three NAND gates 48, 50 and 52 is used. Input to NAND gate 48 is the noninverted output Q of flip flop 44 and the End of Measurement Level (EOML) signal. The EOML signal is the output of the switch shift circuit 40 that is described hereinafter. The EOML signal is also introduced to the inverter 46. The output from the inverter 46 and the inverted output, Q, from the flip-flop 43 are introduced into NAND gate 50. The outputs of NAND gates 48 and 50 are the inputs to NAND gate 52. Thus, the outputs of the flip-flops 43 and 44 as processed by NAND gates 48 and 50 in combination with the EOML signal are finally processed by NAND gate 52. The output of NAND gate 52 is valid immediately after a transition in the state of the EOML signal shown in timing diagram (C) of FIG. 6 and is a logical one if the output of level detector 24 transitions before that of level detector 26 and is a logical zero if the output of level detector 24 transitions after that of level detector 26. The output of NAND gate 52 also serves as a sign bit for the particular time difference being measured. When the output of NAND gate 52 is a logical one, the time difference signal, i.e., TA, TB, TC, or TD is positive. When NAND gate 52 output is a logical zero, the time difference signal is negative. For timing diagram (J) of FIG. 6, time differences TA and TB are positive and time differences TC and TD are negative. By "transitions" it is meant that the state of a signal, such as the output of level detector, either goes from a logical one to a logical zero or from a logical zero to a logical zero. Although the logic is described in terms of positive logic, it should be realized that negative logic can also be used to implement the circuits of FIGS. 2 and 5.

Both the EOML signal and the output of NAND gate 52 are fed into the microprocessor 38. After the microprocessor collects the four time differences, which are output from the counter 34 over about a two cycle period of the input signals from the sensors 16 and 18, the microprocessor 38 adds or subtracts the time differences TA, TB, TC and TD in accordance with the logic set out in FIG. 4 and thereby substantially eliminates errors in measuring time differences. After determination of one of the time differences, the microprocessor 38 will provide an output clear signal, CLR, 53 to the counter 34 on every transition of the EOML signal. This advantageously allows a single counter to be used to gather the four time difference values. On each rising edge of the EOML signal, the microprocessor will provide a switch signal, SW, 54, via a buffer amplifier 55, to the switch 36 for switching the sensors 16 and 18. This is shown in timing diagram (D) of FIG. 6.

The switch shift circuit 40 provides the EOML signal used to switch the signals from sensors inputs 16 and 18 between the amplifiers 20 and 22 at a predetermined time period prior to the signals from the sensors 16 and 18 passing through the level reference point of the level detectors 24 and 26 so that the switching transients will have settled prior to the collection of data. The switch shift circuit 40 consists of an averaging circuit 56, a phase shifter 57, and a level detector 58. The outputs of sensors 16 and 18 are inputs to the averaging circuit 56, output of which is the average of these two signals. This output is then shifted about 90 degrees in the phase shifter 57 whose output is connected to the input of level detector 58. When the phase shifted signal passes through the same predetermined reference point that is used for level detectors 24 and 26, preferably the zero crossing, the output of the level detector 58, which is the EOML signal, will transistion between a logical one and a logical zero. The switch shift circuit 40 acts to anticipate when the signals from the sensors 16 and 18 will next pass through the predetermined reference levels in level detectors 24 and 26. Other phase shifting circuit arrangements can be used such as a differentiator or an integrator as are known in the art. Also, the EOML signal can be produced using only one of the signals from sensors 16 or 18 as the phase difference being detected between these two signals is rather small and an exact timed switching of the input is not critical. The minimum amount of time required for switching should exceed the settling time required by the processing channel circuitry.

Other embodiments of the invention will be apparent to those of skill in the art from consideration of this specification or practice of this invention. The specification is intended as exemplary only with the true scope of the invention being indicated by the following claims.

What is claimed is:

1. An electronic signal processor for cancelling errors arising from variations in operational characteristics of electronic components in circuitry used to determine the time difference between two analog signals having periodic amplitudes, said electronic signal processor comprising:
    first and second digitizing means having an input and output, each digitizing means providing a digital output representative of the input thereto;
    switching means for initially connecting a first analog signal of said two analog signals to the input of said first digitizing means and at the same time the second analog signal of said two analog signals to the input of said second digitizing means, and at a predetermined period prior to the end of one cycle of said two analog signals for further connecting said first analog signal to the input of said second digitizing means and said second analog signal to the input of said first digitizing means, said cycle end determined by reference to a predetermined signal level value;
    first-in-time circuit means for determining which of said first analog signal or said second analog signal is first in time for each of the time differences to be measured;
    time difference measuring means for determining the time differences between the output signals from the first digitizing means and the second digitizing means; and
    computing means for adding and subtracting the time differences determined by said time difference measuring means during the periods of about two cycles of said two analog signals, where the output from said first-in-time circuit means is used for determining if time differences determined by said time difference measuring means are added or subtracted.

2. An electronic signal processor as set forth in claim 1, in which the predetermined time period for said switching means to change the interconnection of said first analog signal and said second analog signal between said first digitizing means and said second digitizing means is set to exceed the settling time required by said first and said second digitizing means.

3. An electronic signal processor as set forth in claim 2, in which said switching means is switched to change the interconnection of said first analog signal and said second analog signal between said first digitizing means and said second digitizing means at about ninety degrees in phase before the end of each cycle of one of said two analog signals.

4. An electronic signal processor as set forth in claim 3, in which the control for switching said switching means is provided from said computing means.

5. An electronic signal processor as set forth in claim 1, in which said first digitizing means and said second digitizing means each include an amplifier circuit and a level detector circuit, the output of the amplifier being input to the level detector circuit the output of which is said digital signal.

6. An electronic signal processor as set forth in claim 5 in which said level detector circuit is a zero crossing type.

7. An electronic signal processor as claimed in claim 1, in which said time difference measuring means includes a counter for counting the output pulses of a fixed frequency oscillator with the beginning and ending of said counting controlled by the output of an EXCLUSIVE OR gate having inputs from each of said first digitizing means and said second digitizing means.

8. An electronic signal processor as claimed in claim 1, in which the determination to add or subtract time differences includes identifying whether time differences are positive or negative, when for a selected time said first analog signal is first in time with respect to said second analog signal then the determined time difference at said selected time is identified as positive, at said selected time said second analog signal is first in time with respect to said first analog signal then the determined time difference is identified as negative, and there being four selected times for determining said time difference, these identifications being:
   (a) when a first determined time difference in the periods of two consecutive cycles of said two analog signals is positive and a third determined time difference in said two consecutive cycles is also positive then the third determined time difference is subtracted from the first determined time difference;

(b) when said first determined time difference in said two consecutive cycles is positive and said third determined time difference in said two consecutive cycles is negative then said third determined time difference is added to said first determined time difference;

(c) when said first determined time difference in said two consecutive cycles is negative and said third determined time difference in said two consecutive cycles is positive then said third determined time difference is added to said first determined time difference with the result of said addition being made negative;

(d) when said first determined time difference in said two consecutive cycles is negative and said third determined time difference in said two consecutive cycles is also negative then said first determined time difference is subtracted from said third determined time difference;

(e) when a second determined time difference in said two consecutive cycles is positive and a fourth determined time difference in said two consecutive cycles is also positive then said fourth determined time difference is subtracted from said second determined time difference;

(f) when said second determined time difference in said two consecutive cycles is positive and said fourth determined time difference in said two consecutive cycles is negative then said fourth determined time difference is added to said second determined time difference;

(g) when said second determined time difference in said two consecutive cycles is negative and said fourth determined time difference in said two consecutive cycles is positive then said fourth determined time difference is added to said second determined time difference with said addition being made negative;

(h) when said second determined time difference in said two consecutive cycles is negative and said fourth determined time difference in said two consecutive cycles is also negative then said second determined time difference is subtracted from said fourth determined time difference; and (i) the combination of said first determined time difference and said third determined time difference is added to the combination of said second determined time difference and said fourth determined time difference, and the added combinations are divided by four.

9. An electronic signal processor as set forth in claim 1, in which said two analog signals are each generated by one of a pair of analog velocity sensor means each of which generates a signal representative of the actual movement of flow conduits of a Coriolis mass flow rate meter, and the time difference between said two signals is indicative of the mass flow rate of a fluid passing through said Coriolis mass flow rate meter.

10. An electronic signal processor as set forth in claim 9, in which each of said generated analog signals are linearly representative of the actual movement of flow conduits of a Coriolos mass flow rate meter, and the time difference between said two signals is proportional to the mass flow rate of a fluid passing through said Coriolis mass flow rate meter.

* * * * *